(12) United States Patent
Yiu et al.

(10) Patent No.: US 9,966,358 B2
(45) Date of Patent: May 8, 2018

(54) CHIP PACKAGE

(71) Applicant: XINTEC INC., Taoyuan (TW)

(72) Inventors: Ho-Yin Yiu, KLN (HK); Ying-Nan Wen, Hsinchu (TW); Chien-Hung Liu, New Taipei (TW); Wei-Chung Yang, Taoyuan (TW)

(73) Assignee: XINTEC INC., Taoyuan (TW)

( * ) Notice: Subject to any disclaimer, the term of this patent is extended or adjusted under 35 U.S.C. 154(b) by 0 days. days.

(21) Appl. No.: 15/164,660

(22) Filed: May 25, 2016

(65) Prior Publication Data

US 2016/0372445 A1    Dec. 22, 2016

Related U.S. Application Data

(60) Provisional application No. 62/181,057, filed on Jun. 17, 2015.

(51) Int. Cl.

| H01L 23/48 | (2006.01) |
|---|---|
| H01L 23/52 | (2006.01) |
| H01L 29/40 | (2006.01) |
| H01L 25/065 | (2006.01) |
| H01L 25/00 | (2006.01) |

(Continued)

(52) U.S. Cl.
CPC ........ *H01L 25/065* (2013.01); *H01L 21/4846* (2013.01); *H01L 21/4853* (2013.01); *H01L 21/4875* (2013.01); *H01L 23/492* (2013.01); *H01L 23/498* (2013.01); *H01L 23/49816* (2013.01); *H01L 23/49838* (2013.01); *H01L 25/0655* (2013.01); *H01L 25/50* (2013.01); *H01L 23/3128* (2013.01); *H01L 2224/16* (2013.01); *H01L 2225/06517* (2013.01); *H01L 2225/06586* (2013.01); *H01L 2924/16235* (2013.01)

(58) Field of Classification Search
CPC . H01L 25/50; H01L 23/49816; H01L 25/065; H01L 23/49838
See application file for complete search history.

(56) References Cited

U.S. PATENT DOCUMENTS 8,594,966 B2 * 11/2013 Madrid ................. H01L 25/065
                                                                 702/118
2006/0231958 A1 * 10/2006 Yang ..................... H01L 25/065
                                                                 257/777

(Continued)

*Primary Examiner* — Matthew Reames
*Assistant Examiner* — Wilner Jean Baptiste
(74) *Attorney, Agent, or Firm* — Liu & Liu

(57) ABSTRACT

A chip package is provided. The chip package includes a substrate having conductive pads therein and adjacent to a first surface thereof. Chips are attached on a second surface opposite to the first surface of the substrate, and an encapsulation layer covers the chips. First redistribution layers are disposed between the second surface of the substrate and the encapsulation layer, and second redistribution layers are disposed on the encapsulation layer. First conductive structures and second conductive structures are disposed in the encapsulation layer. Each of first and second conductive structures respectively includes at least one bonding ball. The first conductive structures are configured to connect first and second redistribution layers, and the second conductive structures are configured to connect the second redistribution layers and the chip. A method of forming the chip package is also provided.

8 Claims, 18 Drawing Sheets

(51) Int. Cl.
*H01L 23/498* (2006.01)
*H01L 23/492* (2006.01)
*H01L 21/48* (2006.01)
*H01L 23/31* (2006.01)

(56) References Cited

U.S. PATENT DOCUMENTS

| | | | |
|---|---|---|---|
| 2009/0302439 A1* | 12/2009 | Pagaila | H01L 23/29 257/660 |
| 2010/0197071 A1* | 8/2010 | Park | H01L 27/14683 438/70 |
| 2011/0084382 A1* | 4/2011 | Chen | H01L 24/97 257/737 |
| 2013/0037950 A1* | 2/2013 | Yu | H01L 23/49816 257/738 |
| 2013/0153933 A1* | 6/2013 | Lee | H01L 31/1876 257/82 |
| 2014/0076617 A1* | 3/2014 | Chen | H01L 25/105 174/255 |

\* cited by examiner

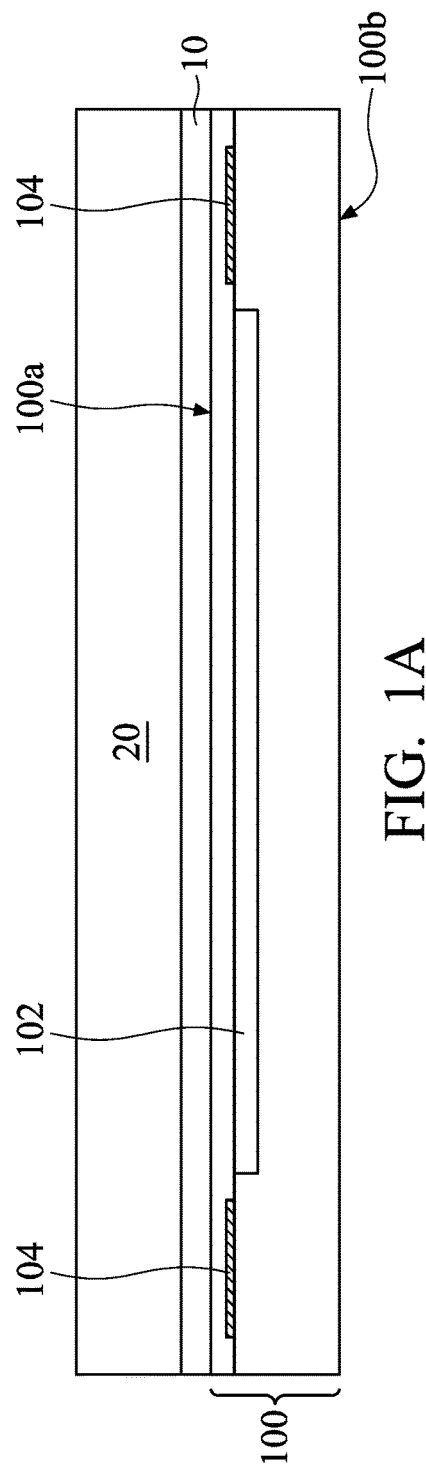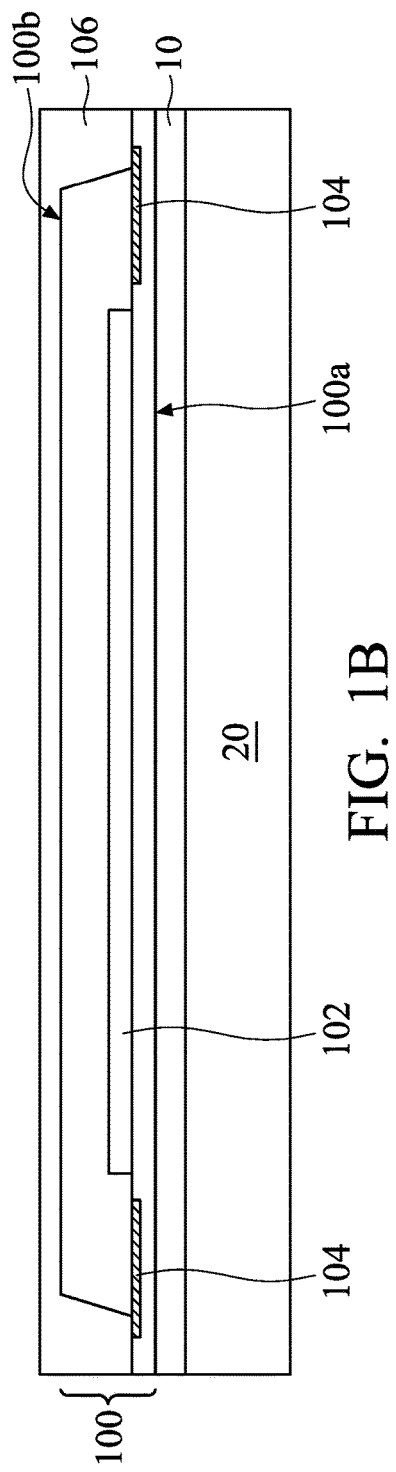
FIG. 1A
FIG. 1B

CHIP PACKAGE

CROSS REFERENCE TO RELATED APPLICATIONS

This application claims the benefit of U.S. Provisional Application No. 62/181,057 filed on Jun. 17, 2015, the entirety of which is incorporated by reference herein.

BACKGROUND OF THE INVENTION

Field of the Invention

The invention relates to chip package technology, and in particular to a chip package and methods for forming the same.

Description of the Related Art

As demand increases for electronic or optoelectronic products such as digital cameras, camera phones, barcode readers, and monitors, semiconductor technology for products made from such components must develop rapidly, as product trends require miniaturization of semiconductor chips, as well as increased, and increasingly complex, functionality of such semiconductor chips.

Due to performance demands, semiconductor chips are typically placed in a sealed package for operational stability. Therefore, the chip package process is an important process in the fabrication of electronic products. The chip package not only protects the chip therein from ambient contamination, but it also provides electrical connections between the interior electronic devices and the exterior circuits. However, with the complicated functionality of the electronic or optoelectronics products, there is a need to increase the number of the chip packages to meet the demand for electronic or optoelectronic products. As a result, it is difficult to maintain or reduce the size of electronic or optoelectronic products.

Accordingly, there exists a need in the art for development of a chip package and methods for forming the same capable of mitigating or eliminating the aforementioned problems.

BRIEF SUMMARY OF THE INVENTION

An embodiment of the invention provides a chip package which includes a substrate having a first surface and a second surface opposite thereto. The substrate includes a sensor device and a plurality of conductive pads that are adjacent to the first surface. The chip package further includes a plurality of chips that is attached onto the second surface of the substrate. The chip package further includes an encapsulation layer that is disposed on the second surface of the substrate to cover the plurality of chips. The chip package further includes a plurality of first redistribution layers (RDLs) that is disposed between the second surface of the substrate and the encapsulation layer and electrically connected to the plurality of conductive pads. The chip package further includes a plurality of second RDLs that is disposed on the encapsulation layer. The chip package further includes a plurality of first conductive structures and a plurality of second conductive pads that are disposed in the encapsulation layer. Each of the plurality of first conductive structures and each of the plurality of second conductive structures respectively include at least one bonding ball. Moreover, at least one of the plurality of first conductive structures is configured to connect at least one of the plurality of first RDLs and at least one of the plurality of second RDLs, and at least one of the plurality of second conductive structures is configured to connect at least one of the plurality of second RDLs and at least one of the plurality of chips.

An embodiment of the invention provides a method for forming a chip package that includes providing a first substrate having a first surface and a second surface opposite thereto. The substrate includes a sensor device and a plurality of conductive pads that are adjacent to the first surface. A plurality of first RDLs is formed on the second surface of the substrate and a plurality of chips is attached onto the second surface of the substrate, in which the plurality of first RDLs is electrically connected to the plurality of conductive pads. A plurality of first conductive structures is formed on the plurality of first RDLs and a plurality of second conductive pads is formed on the plurality of chips. Each of the plurality of first conductive structures and each of the plurality of second conductive structures respectively include at least one bonding ball. An encapsulation layer is formed on the second surface of the substrate to cover the plurality of chips and the plurality of first RDLs, and expose the plurality of first conductive structures and the plurality of second conductive structures. A plurality of second RDLs is formed on the encapsulation layer. The plurality of second RDLs is electrically connected to the plurality of first RDLs via the plurality of first conductive structures, and electrically connected to the plurality of chips via the plurality of second conductive structures.

Another embodiment of the invention provides a chip package which includes a substrate having a first surface and a second surface opposite thereto. The substrate includes a sensor device and a plurality of conductive pads that are adjacent to the first surface. The chip package further includes a plurality of chips that is attached onto the second surface of the substrate. The plurality of chips includes a plurality of metal bumps. The chip package further includes an encapsulation layer that is disposed on the second surface of the substrate to cover the plurality of chips and expose the plurality of metal bumps. The chip package further includes a plurality of RDLs that is disposed on the encapsulation layer and electrically connected to plurality of conductive pads and the plurality of exposed metal bumps.

Another embodiment of the invention provides a method for forming a chip package that includes providing a first substrate having a first surface and a second surface opposite thereto. The substrate includes a sensor device and a plurality of conductive pads that are adjacent to the first surface. A plurality of chips is attached onto the second surface of the substrate. The plurality of chips includes a plurality of metal bumps. An encapsulation layer is form on the second surface of the substrate to cover the plurality of chips and expose the plurality of metal bumps. A plurality of RDLs is formed on the encapsulation layer. The plurality of RDLs is electrically connected to plurality of conductive pads and the plurality of exposed metal bumps.

BRIEF DESCRIPTION OF THE DRAWINGS

The present invention can be more fully understood by reading the subsequent detailed description and examples with references made to the accompanying drawings, wherein:

FIGS. 1A to 1G are cross-sectional views of an exemplary embodiment of a method for forming a chip package according to the invention.

DETAILED DESCRIPTION OF THE INVENTION

The making and using of the embodiments of the present disclosure are discussed in detail below. However, it should be noted that the embodiments provide many applicable inventive concepts that can be embodied in a variety of specific methods. The specific embodiments discussed are merely illustrative of specific methods to make and use the embodiments, and do not limit the scope of the disclosure. In addition, the present disclosure may repeat reference numbers and/or letters in the various embodiments. This repetition is for the purpose of simplicity and clarity, and does not imply any relationship between the different embodiments and/or configurations discussed. Furthermore, when a first material layer is referred to as being on or overlying a second material layer, the first material layer may be in direct contact with the second material layer, or spaced apart from the second material layer by one or more material layers.

A chip package according to an embodiment of the present invention may be used to package micro-electro-mechanical system chips. However, embodiments of the invention are not limited thereto. For example, the chip package of the embodiments of the invention may be implemented to package active or passive devices or electronic components of integrated circuits, such as digital or analog circuits. For example, the chip package is related to optoelectronic devices, micro-electro-mechanical systems (MEMS), biometric devices, micro fluidic systems, and physical sensors measuring changes to physical quantities such as heat, light, capacitance, pressure, and so on. In particular, a wafer-level package (WSP) process may optionally be used to package semiconductor chips, such as image-sensor elements, light-emitting diodes (LEDs), solar cells, RF circuits, accelerators, gyroscopes, fingerprint recognition devices, micro actuators, surface acoustic wave devices, pressure sensors, ink printer heads, and so on.

The above-mentioned wafer-level package process mainly means that after the packaging step is accomplished during the wafer stage, the wafer with chips is cut to obtain individual packages. However, in a specific embodiment, separated semiconductor chips may be redistributed on a carrier wafer and then packaged, which may also be referred to as a wafer-level package process. In addition, the above-mentioned wafer-level package process may also be adapted to form a chip package having multilayer integrated circuit devices by stacking (stack) a plurality of wafers having integrated circuits.

Figure 1C:
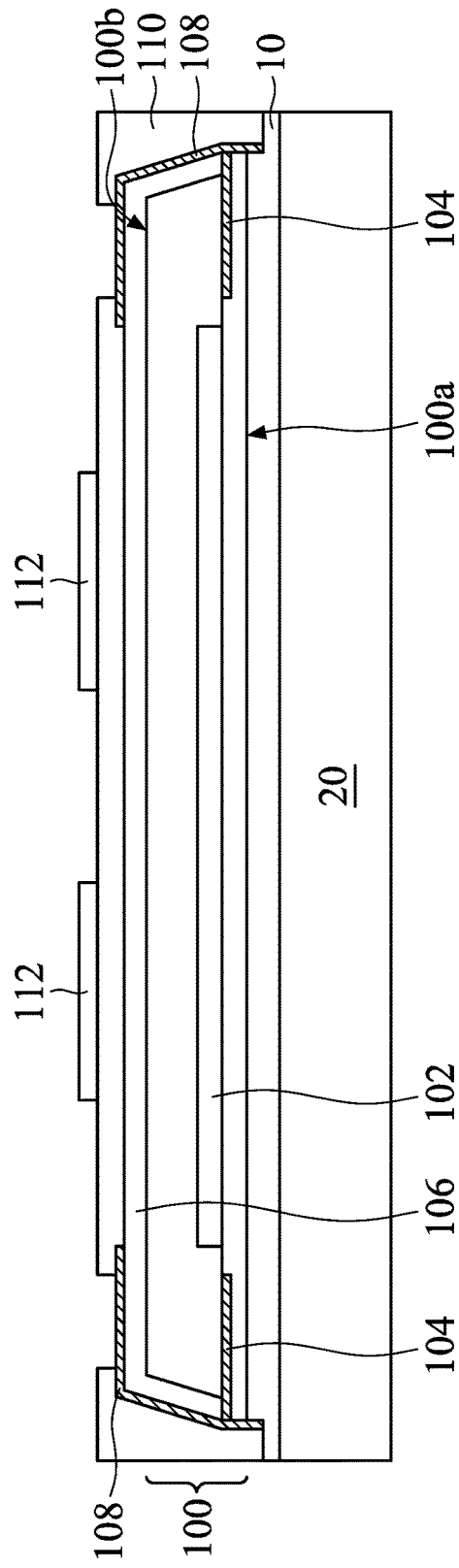
Figure 1D:
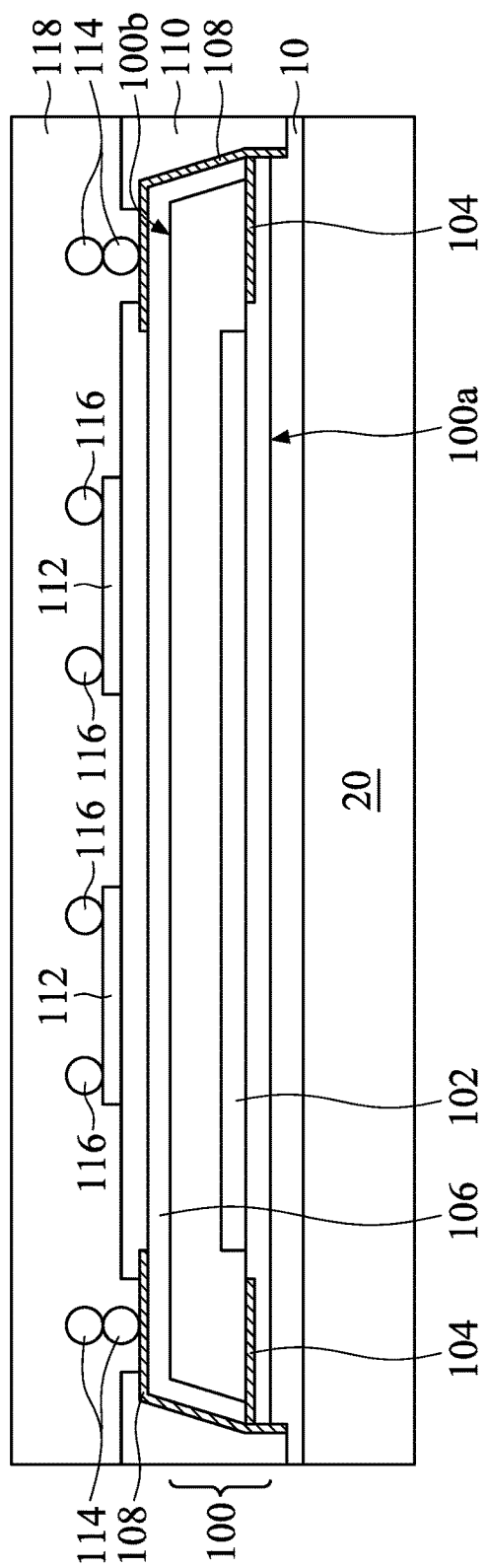
Figure 1E:
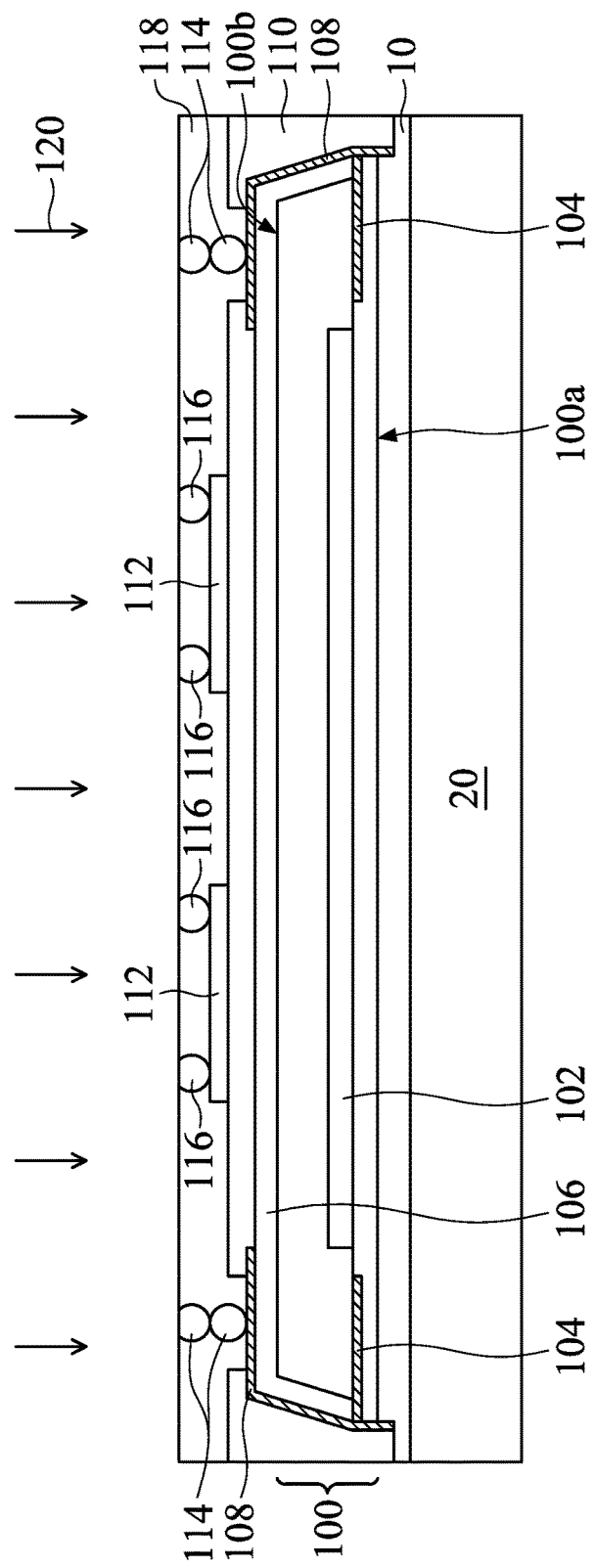
Figure 1F:
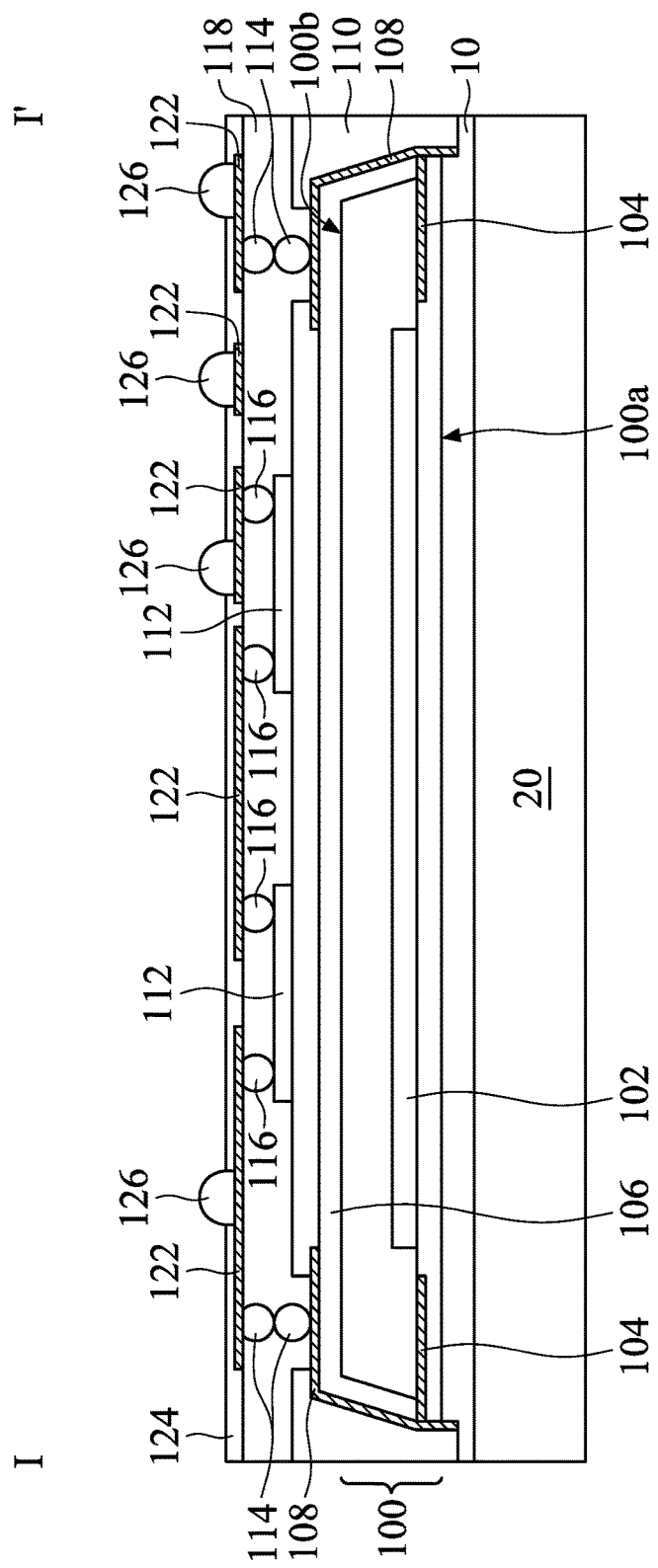
Figure 1G:
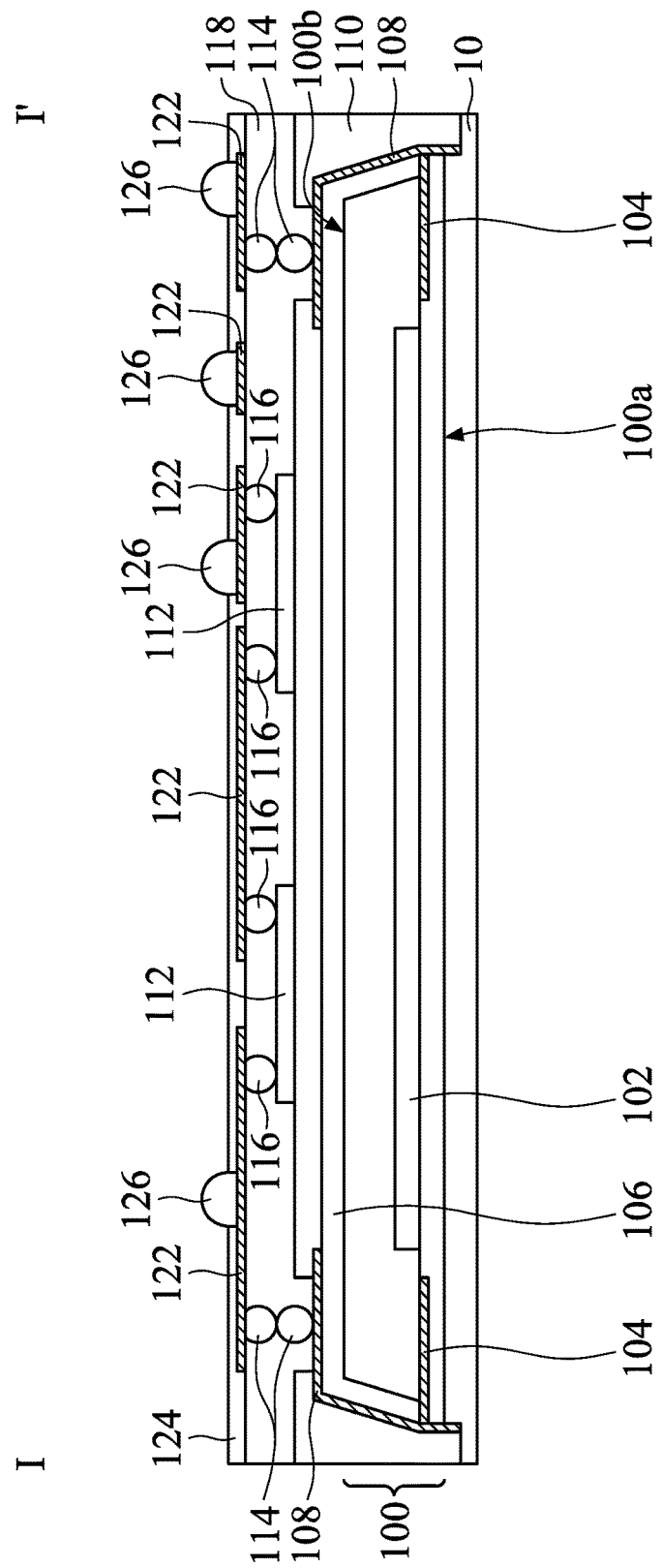
Figure 2:
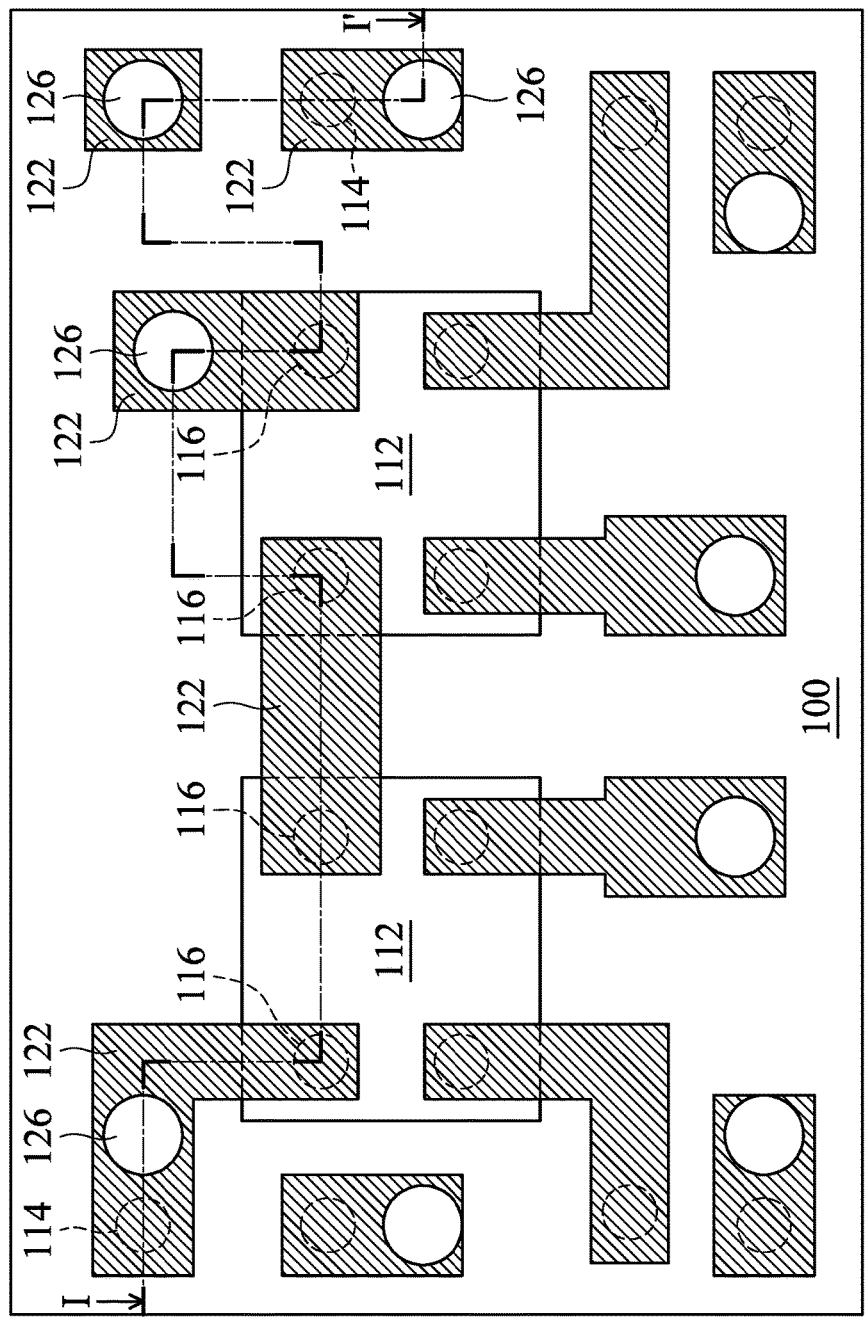
FIG. 2 is a plan view of the chip package shown in FIG. 1G.

Refer to FIGS. 1G and 2, in which a cross-sectional view and a plan view of an exemplary embodiment of a chip package according to the invention are respectively illustrated, and in which FIG. 1G shows a cross-sectional view along I-I' line shown in FIG. 2. In the embodiment, the chip package includes a substrate 100. In the embodiment, the substrate includes a body and a metallization layer formed on the body. In one embodiment, the body may include a silicon or another semiconductor body. Moreover, the substrate 100 has a first surface 100a and a second surface 100b opposite thereto.

In one embodiment, the substrate 100 has a sensor device 102 and one or more conductive pads 104 therein. Typically, the sensor device 102 is disposed in the body and the conductive pad 104 is disposed in the metallization layer and may be an uppermost metal layer. Moreover, the sensor device 102 and the conductive pad 104 may be adjacent to first surface 100a (e.g., the upper surface of the metallization layer). In one embodiment, the sensor device 102 is configured to sense biometrics and may include a fingerprint-recognition device. In some embodiments, the sensor device 102 is configured to sense environmental characteristics and may include a temperature-sensing element, a humidity-sensing element, a pressure-sensing element, a capacitance-sensing element, or another suitable sensing element. In one embodiment, the sensing element in the sensor device 102 may be electrically connected to the conductive pad 104 via the interconnect structures (not shown) in the substrate 100.

In the embodiment, each conductive pad 104 has a sidewall that laterally protrudes from the sidewall of the substrate 100. In one embodiment, the conductive pad may be formed of a single conductive layer or multiple conductive layers. To simplify the diagram, only two conductive pads 104 formed of a single conductive layer in the substrate 100 are depicted herein as an example (as shown in FIG. 1G).

In the embodiment, the chip package further includes one or more chips 112 that are attached onto the second surface 100b of the substrate 100. In one embodiment, the chip 112 is used for processing the signals from the sensor device 102 and may be an image signal process (ISP) chip or an application-specific integrated circuit (ASIC) chip. For example, the sensor device 102 may include a fingerprint-recognition device, and the chip 112 may include an ASIC chip. To simplify the diagram, only two chips 112 are depicted herein as an example.

In the embodiment, the chip package further includes an encapsulation layer 118 that is disposed on the second surface 100b of the substrate 100 to cover the chip 112. In the embodiment, the encapsulation layer 118 may comprise epoxy resin, inorganic materials (such as silicon oxide, silicon nitride, silicon oxynitride, metal oxide or a combination thereof), organic polymer materials (such as polyimide, butylcyclobutene (BCB), parylene, polynaphthalenes, fluorocarbons or acrylates), or another suitable insulating material.

In the embodiment, the chip package further includes an insulating layer 106 and first redistribution layers (RDLs) 108 that are successively disposed on the second surface 100b of the substrate 100, so that the first RDLs 108 are between the second surface 100b of the substrate 100 and the encapsulation layer 118 and is insulated from the substrate 100 via the insulating layer 106. In one embodiment, the insulating layer 106 may comprise epoxy resin, inorganic materials (such as silicon oxide, silicon nitride, silicon oxynitride, metal oxide or a combination thereof), organic polymer materials (such as polyimide, epoxy, parylene, polynaphthalenes, fluorocarbons or acrylates), or another suitable insulating material.

In the embodiment, the RDLs 108 and the insulating layer 106 extend along the sidewall of the substrate 100. Moreover, the sidewalls of the conductive pads 104 are electrically connected to the first RDLs 108 on the sidewall of the substrate 100 in the manner of a T-contact. In one embodiment, the first RDLs 108 may comprise copper, aluminum, gold, platinum, nickel, tin, a combination thereof, or another suitable conductive material. In some embodiments, the first RDLs 108 may comprise a conductive polymer material, a conductive oxide material (such as indium tin oxide or indium zinc oxide).

In the embodiment, the chip package further includes second RDLs 122 that are disposed on the encapsulation layer 118. The second RDLs 122 serve as an electrical connection between the first RDLs 108 and the chip 112 and serve as an electrical connection between the chips 122 (as shown in FIG. 2). In one embodiment, the second RDLs 122 may comprise a material that is the same as or similar to that of the first RDLs 108.

In the embodiment, the chip package further includes a passivation layer 110 that is disposed between the second surface 100b of the substrate 100 and the encapsulation layer 118 and covers the first RDLs 108 and the insulating layer 106. In the embodiment, the passivation layer 110 includes openings therein to expose portions of the first RDLs 108 on the second surface 100b of the substrate 100. In one embodiment, the passivation layer 110 may comprise epoxy resin, solder mask, inorganic materials (such as silicon oxide, silicon nitride, silicon oxynitride, metal oxide or a combination thereof), organic polymer materials (such as polyimide, BCB, parylene, polynaphthalenes, fluorocarbons or acrylates), photoresist material, or another suitable insulating material.

In the embodiment, the chip package further includes first conductive structures 114 and second conductive structures 116 that are disposed in the encapsulation layer 118. The first conductive structures 114 are correspondingly disposed in the openings of the passivation layer 110, so as to directly contact the exposed portions of the first RDLs 108, thereby electrically connecting the first RDLs 108. The second conductive structures 116 are disposed on the chips 112, so as to electrically connect the chips 112. In this case, at least one of the first conductive structures 114 is configured to connect at least one of the first RDLs 108 and at least one of the second RDLs 122. Moreover, at least one of the second conductive structures 116 is configured to connect at least one of the second RDLs 122 and at least one of the chips 112.

In one embodiment, each first conductive structure 114 and each second conductive structure 116 respectively include at least one bonding ball, such as a metal bonding ball. For example, each first conductive structure 114 includes two or more bonding balls that are stacked on one of the first RDLs 108 in a direction perpendicular to the second surface 100b of the substrate 100. Each second conductive structure is disposed on one of the chips 112 and includes a single bonding ball.

In one embodiment, the upper surfaces of the first conductive structures 114, the second conductive structures 116 and the encapsulation layer 118 are level with each other and adjacent to the second RDLs 122. Namely, the first conductive structures 114 and the second conductive structures 116 are exposed from the encapsulation layer 118, such that the first conductive structures 114 and the second conductive structures 116 are respectively electrically connected to the second RDLs 122.

In the embodiment, the chip package further includes a passivation layer 124 that covers the encapsulation layer 118 and the second RDLs 122. In the embodiment, the passivation layer 124 includes openings therein, so as to expose portions of the second RDLs 122 on the encapsulation layer 118. In one embodiment, the passivation layer 124 may include a material that is the same as or similar to that of the passivation layer 110.

In the embodiment, the chip package further includes solder bumps 126 and dummy solder bumps (not shown) that are disposed over the encapsulation layer 118 and pass through the passivation layer 124. In one embodiment, the solder bumps 126 are electrically connected to the second RDLs 122 via the openings of the passivation layer 124. Moreover, the dummy solder bumps are not electrically connected to the devices in the substrate 100 and the chips 112. In one embodiment, the solder bumps 126 and the dummy solder bumps may comprise tin, lead, copper, gold, nickel, or a combination thereof.

In the embodiment, the chip package further includes a cover plate 10 that covers the first surface 100a of the substrate 100, so as to protect the sensor device 102. In one embodiment, the cover plate 10 may comprise epoxy resin, BCB resin, or another suitable insulating material.

Figure 3A:
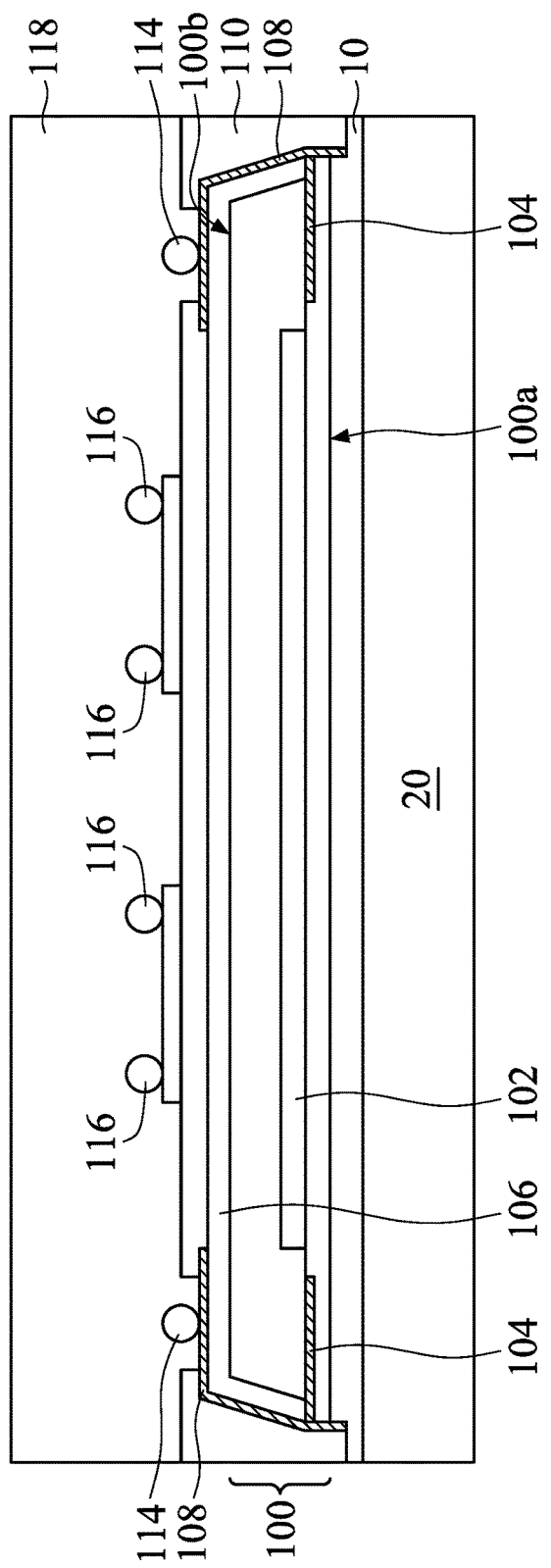
FIGS. 3A to 3D are cross-sectional views of another exemplary embodiment of a method for forming a chip package according to the invention.
Figure 3B:
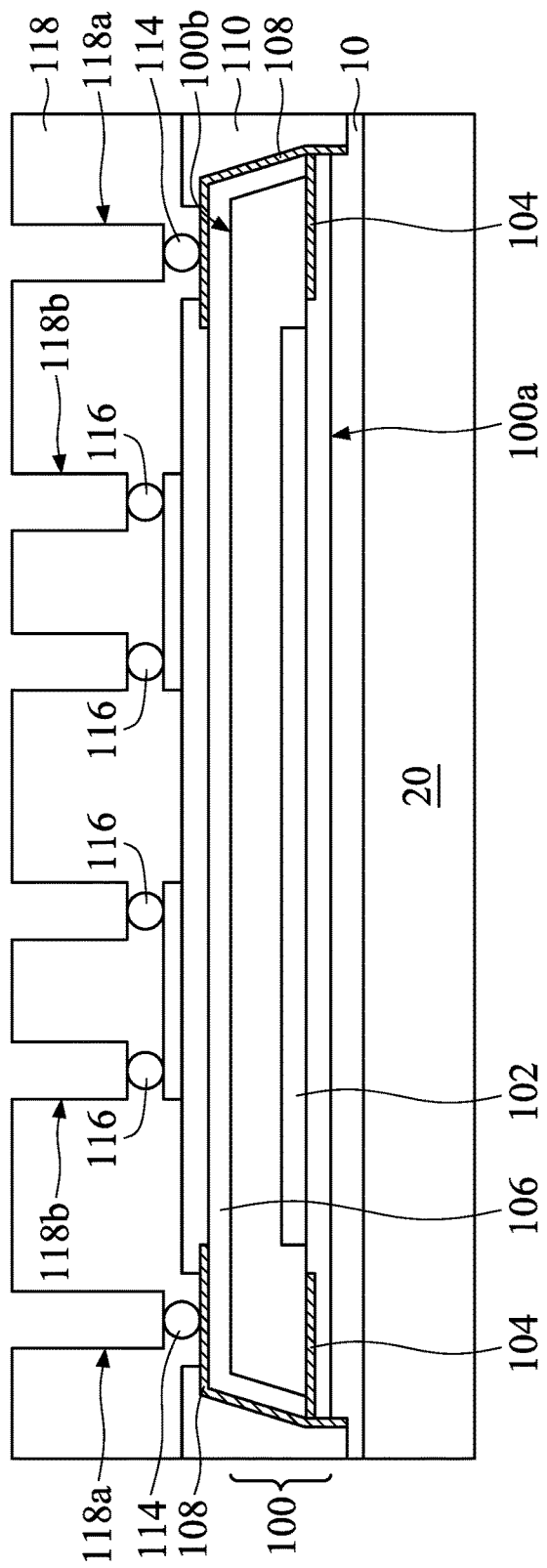
Figure 3C:
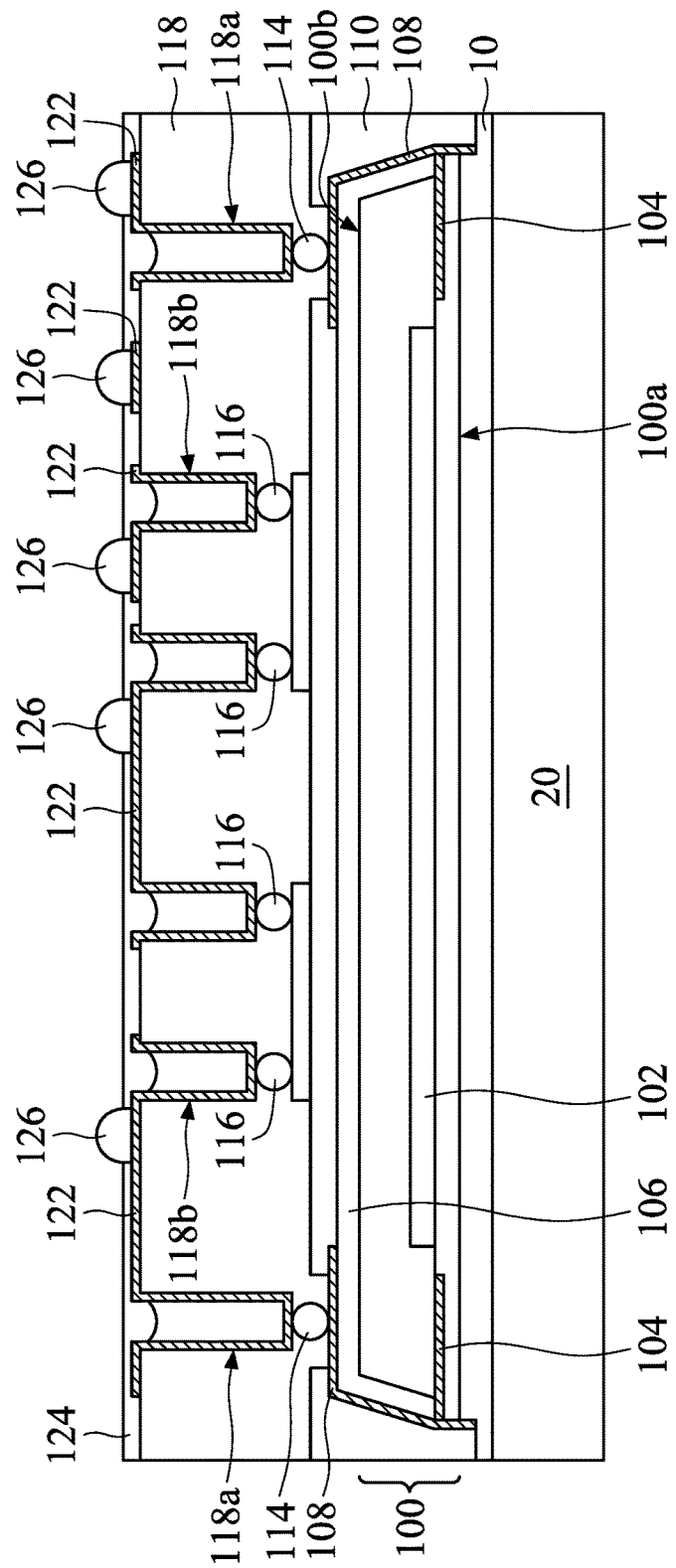
Figure 3D:
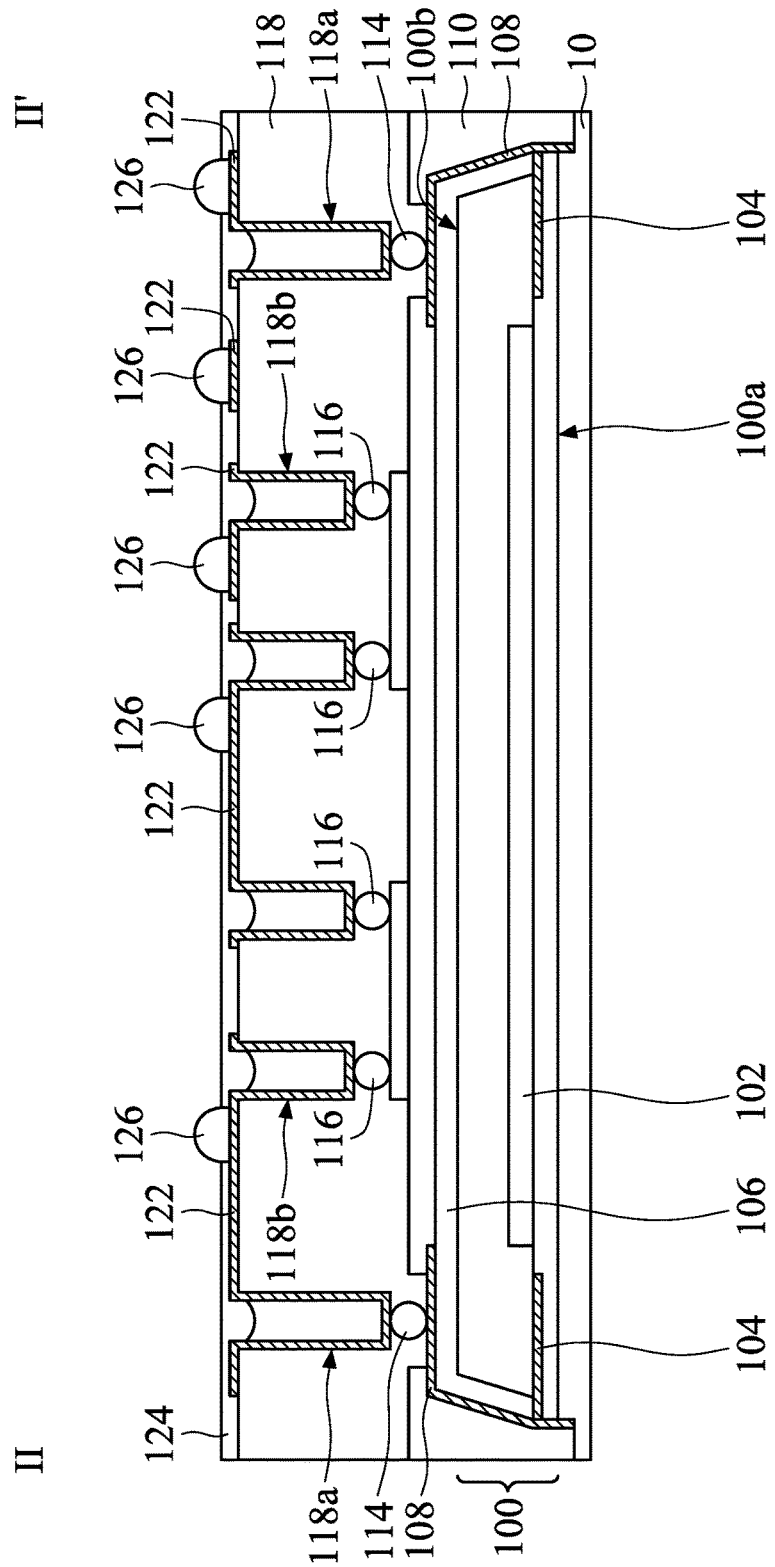
Figure 4:
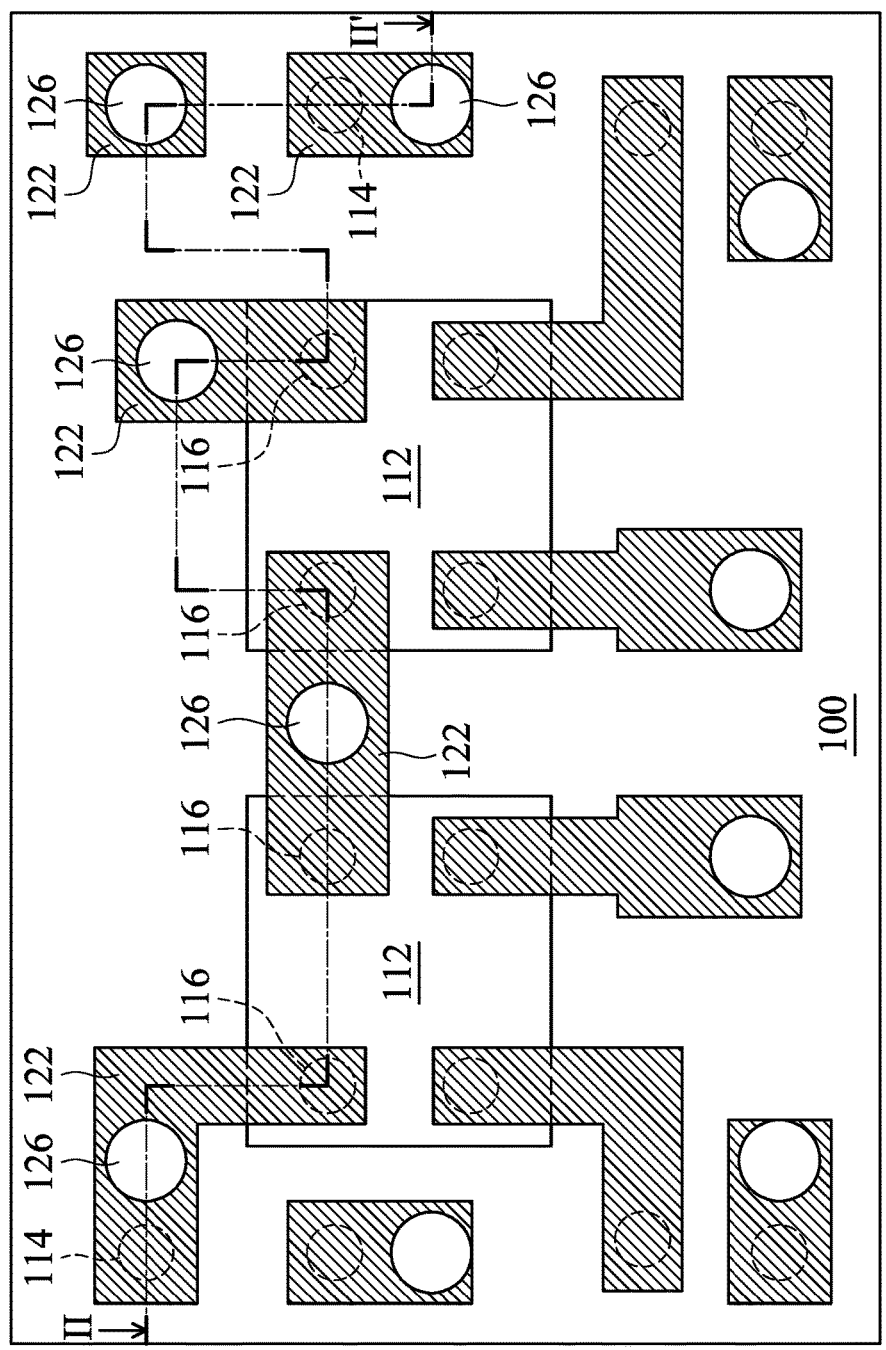
FIG. 4 is a plan view of the chip package shown in FIG. 3D.

Refer to FIGS. 3D and 4, in which a cross-sectional view and a plan view of an exemplary embodiment of a chip package according to the invention are respectively illustrated, and in which FIG. 3D shows a cross-sectional view along II-II' line shown in FIG. 4. Moreover, elements in 3D and 4 that are the same as those in FIGS. 1G and 2 are labeled with the same reference numbers as in FIGS. 1G and 2 and are not described again for brevity. In the embodiment, the structure of the chip package is similar to the structure of the chip structure shown in FIG. 1G. The difference is that each first conductive structure 114 in FIG. 3D is a single bonding ball. Therefore, the upper surfaces of the first conductive structures 114, the second conductive structures 116, and the encapsulation layer 118 are not level with each other. Additionally, the encapsulation layer 118 includes first openings 118a to expose the first conductive structures 114. Moreover, the encapsulation layer 118 includes second openings 118b to expose the second conductive structures 116. In this case, the second RDL 122 extends into one of the first openings 118a and one of the second opening 118b to connect to one of the first conductive structures 114 and one of the second conductive structures 116. Moreover, another second RDL 122 may extend into another second opening 118b, so as to connect the second conductive structure 116 on another chip 122.

Compared to the encapsulation layer 118 of the chip package shown in FIG. 1G, the encapsulation layer 118 of the chip package shown in FIG. 3D has a greater thickness. Moreover, in the embodiment, the passivation layer 124 may partially fill the first openings 118a and the second openings 118b, so that gaps are formed between the second RDLs 122 and the passivation layer 124 in the first and second openings 118a and 118b. In some embodiments, the passivation layer 124 may fully fill the first and second openings 118a and 118b.

Figure 5A:
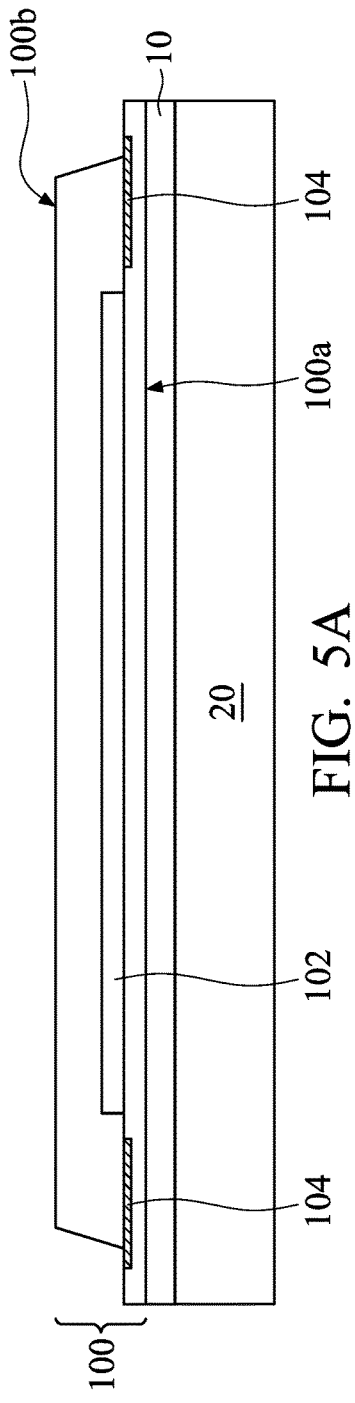
FIGS. 5A to 5F are cross-sectional views of yet another exemplary embodiment of a method for forming a chip package according to the invention.
Figure 5B:
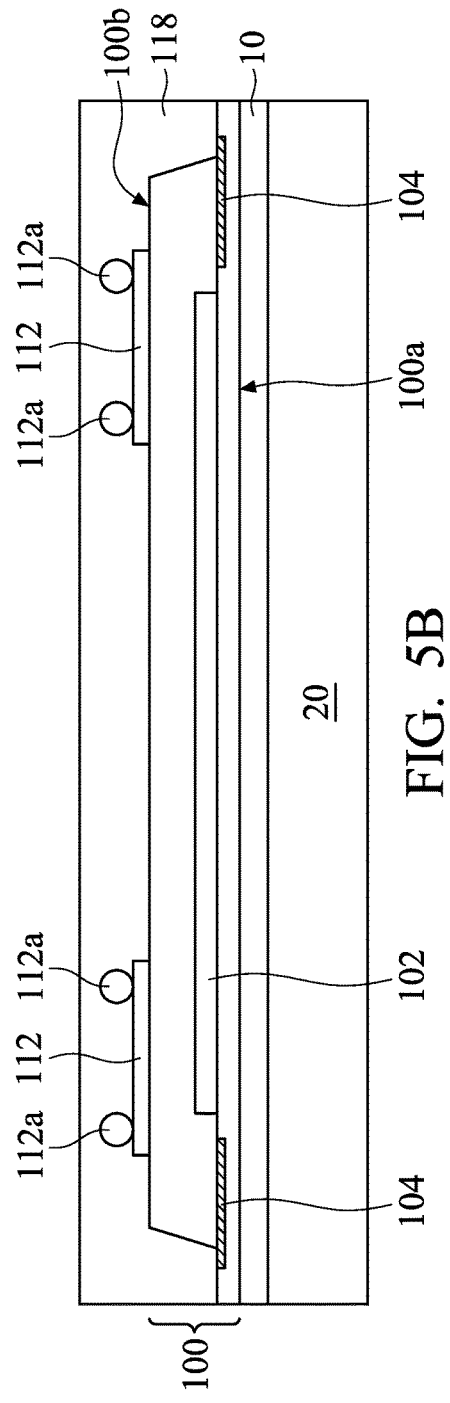
Figure 5C:
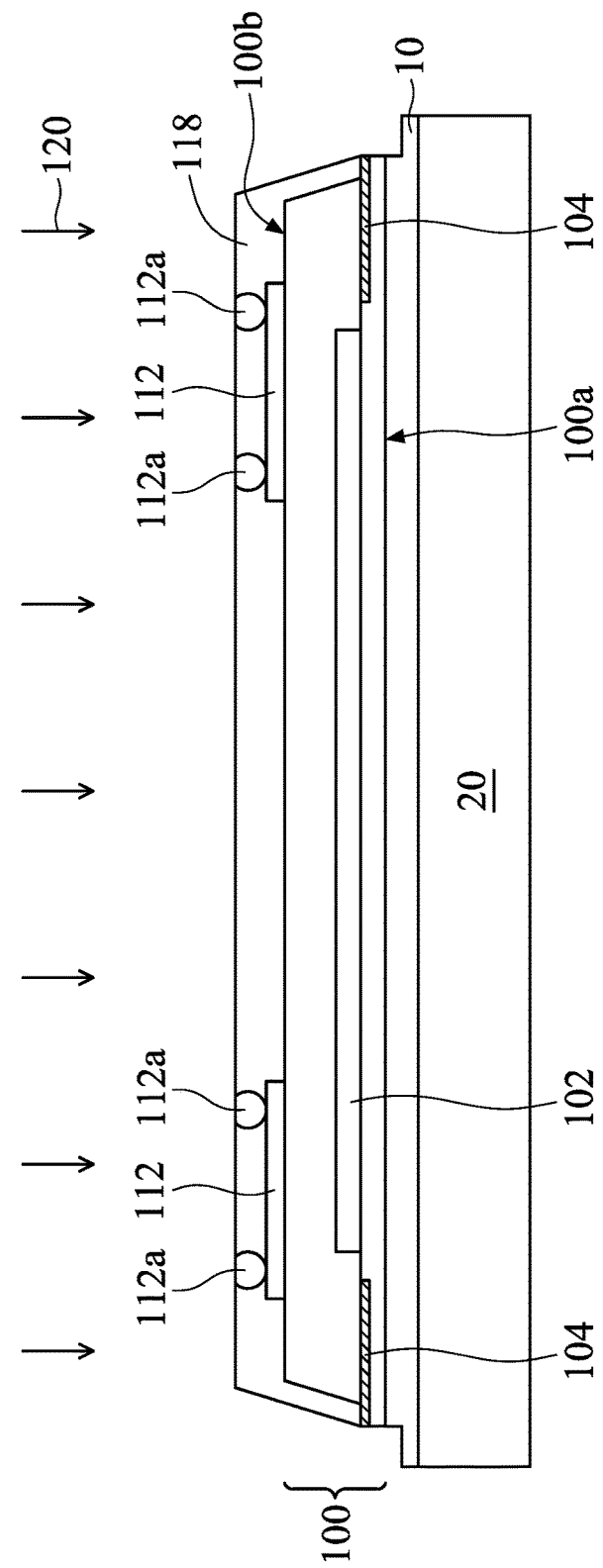
Figure 5D:
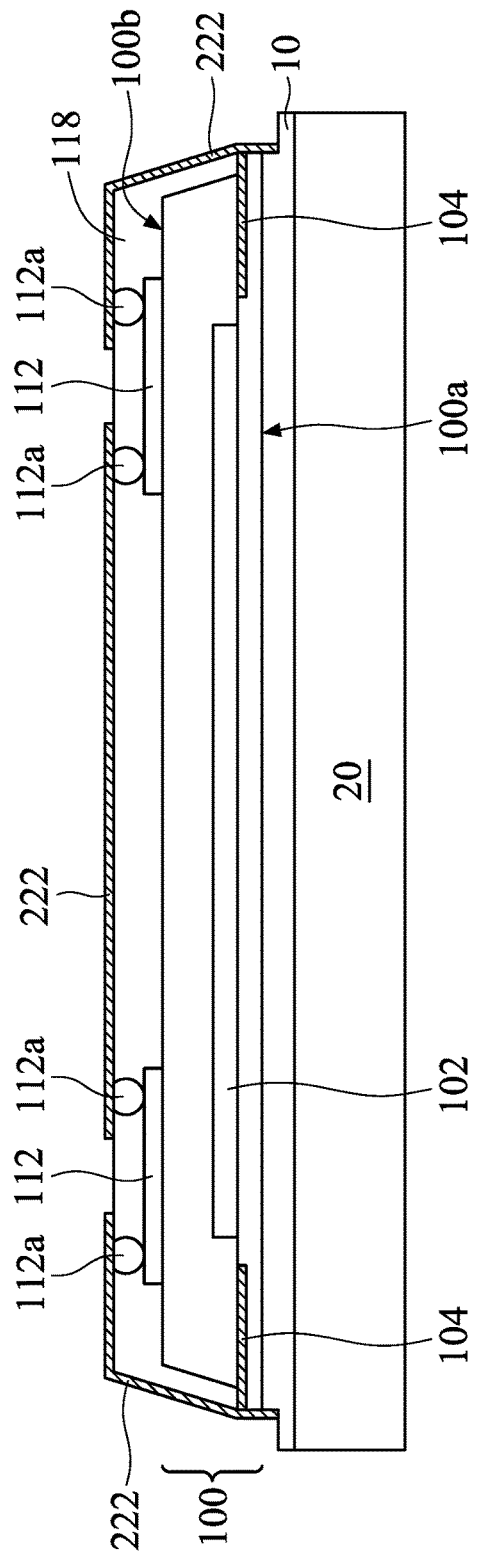
Figure 5E:
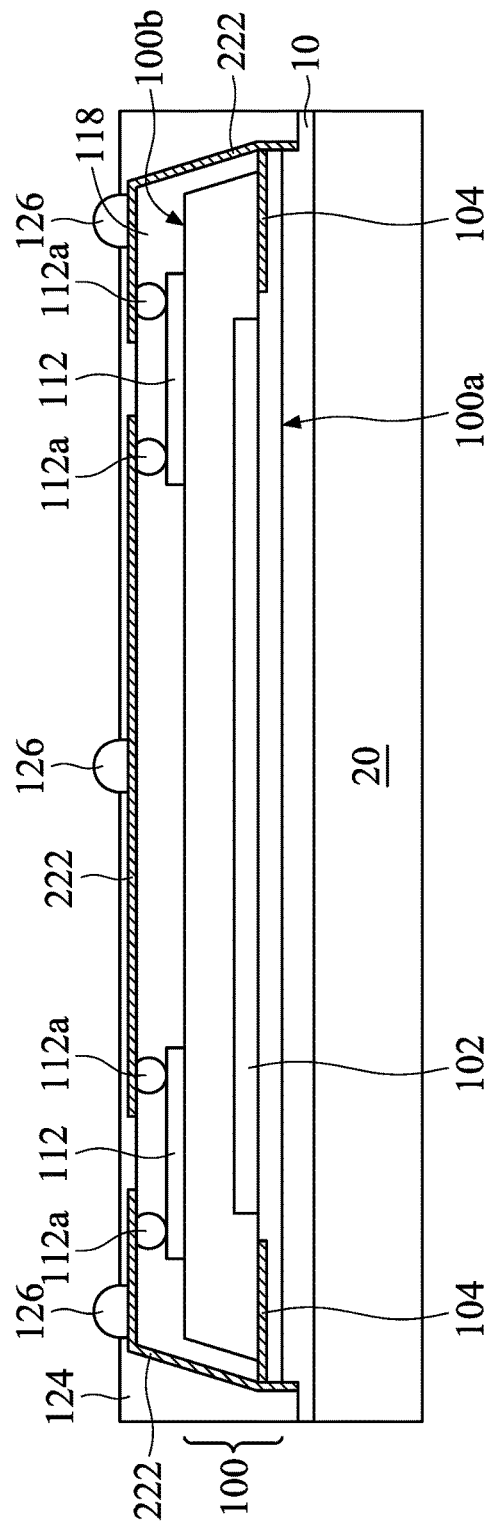
Figure 5F:
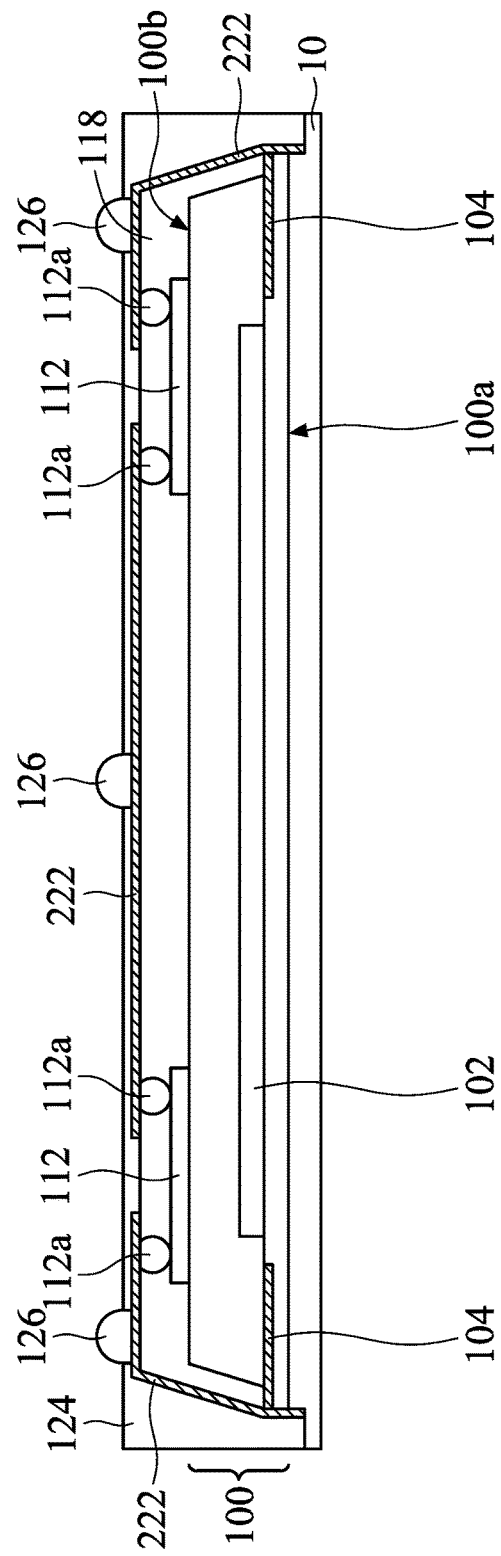
Figure 6:
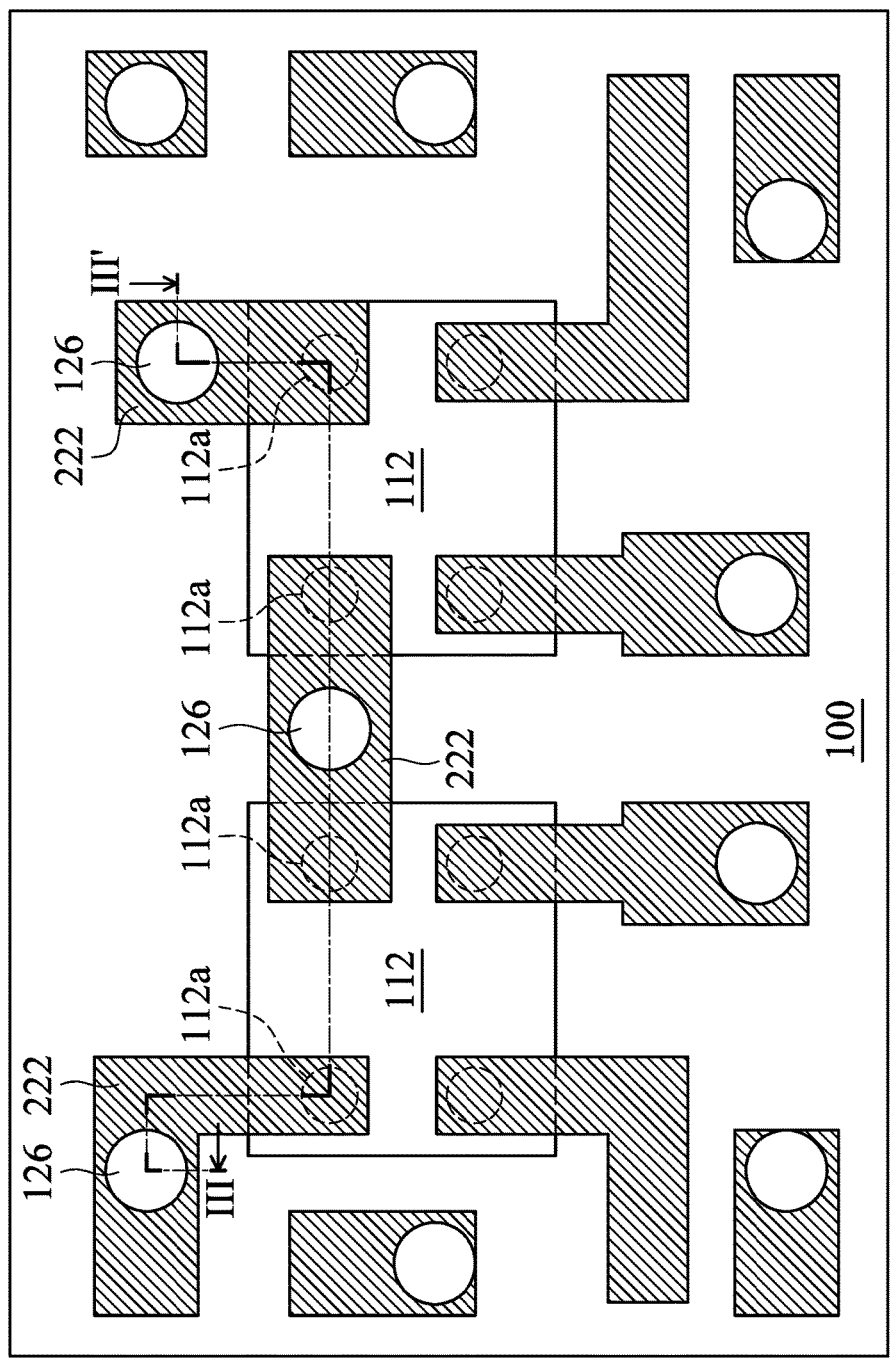
FIG. 6 is a plan view of the chip package shown in FIG. 5F.

Refer to FIGS. 5F and 6, in which a cross-sectional view and a plan view of an exemplary embodiment of a chip package according to the invention are respectively illustrated, and in which FIG. 5F shows a cross-sectional view along line shown in FIG. 6. Moreover, elements in 5F and 6 that are the same as those in FIGS. 1G and 2 are labeled with the same reference numbers as in FIGS. 1G and 2 and are not described again for brevity. In the embodiment, the chip package includes a substrate 100 that has a first surface 100a and a second surface 100b opposite thereto. The substrate 100 has a sensor device 102 and one or more conductive pads 104 therein. Moreover, the sensor device 102 and the conductive pad 104 may be adjacent to first surface 100a of the substrate 100.

In the embodiment, the chip package further includes one or more chips 112 that are attached onto the second surface 100b of the substrate 100 via an adhesive layer (not shown). In one embodiment, the chip 112 is used for processing the signals from the sensor device 102. For example, the sensor device 102 may include a fingerprint-recognition device, and the chip 112 may include an ASIC chip. To simplify the diagram, only two chips 112 are depicted herein as an example. In the embodiment, each chip 112 has metal bumps 112a. In one embodiment, the metal bumps 112a may include solder balls, conductive posts or other suitable conductive structures and may comprise tin, lead, copper, gold, nickel, or a combination thereof, or another suitable conductive material.

In the embodiment, the chip package further includes an encapsulation layer 118 that is disposed on the second surface 100b of the substrate 100, so as to cover the chips 112 and expose the metal bumps 112a.

In the embodiment, the chip package further includes RDLs 222 that are disposed on the encapsulation layer 118. In the embodiment, the upper surfaces of the metal bumps 112a and the encapsulation layer 118 are level with each other and adjacent to the RDLs 222, such that the RDLs 222 are electrically connected to the exposed metal bumps 112a. Moreover, the RDLs 222 extend along the sidewall of the substrate 100, so as to electrically connect the conductive pads 104 that laterally protrude from the sidewall of the substrate 100 in the manner of a T-contact. In one embodiment, the RDLs 222 comprise a material that is the same as or similar to that of the first RDLs 108.

In the embodiment, the chip package further includes a passivation layer 124 that covers the encapsulation layer 118 and the RDLs 222. In the embodiment, the passivation layer 124 has openings therein, so as to expose portions of the RDLs 222 on the encapsulation layer 118.

In the embodiment, the chip package further includes solder bumps 126 and dummy solder bumps (not shown) that are disposed over the encapsulation layer 118 and pass through the passivation layer 124. In one embodiment, the solder bumps 126 are electrically connected to the second RDLs 222 via the openings of the passivation layer 124.

In the embodiment, the chip package further includes a cover plate 10 that covers the first surface 100a of the substrate 100, so as to protect the sensor device 102.

Compared to the encapsulation layer 118 of the chip package shown in FIG. 1G, the encapsulation layer 118 of the chip package shown in FIG. 5F has a less thickness.

Refer to FIGS. 1A to 1G, which illustrate cross-sectional views of an exemplary embodiment of a method for forming a chip package according to the invention. As shown in FIG. 1A, a substrate 100 that includes a body and a metallization layer formed on the body is provided. In one embodiment, the body may include a silicon or another semiconductor body. Moreover, the substrate 100 has a first surface 100a and a second surface 100b opposite thereto. In one embodiment, the substrate 100 is a chip. In another embodiment, the substrate 100 is a wafer for facilitating the wafer-level packaging process. In the embodiment, the substrate 100 includes chip regions. To simplify the diagram, only a single chip region of the substrate 100 is depicted herein.

In the embodiment, the chip region of the substrate 100 has a sensor device 102 and one or more conductive pads 104 therein. Typically, the sensor device 102 is disposed in the body and the conductive pad 104 is disposed in the metallization layer and may be an uppermost metal layer. Moreover, the sensor device 102 and the conductive pad 104 may be adjacent to first surface 100a (e.g., the upper surface of the metallization layer). In one embodiment, the sensing element in the sensor device 102 may be electrically connected to the conductive pad 104 via the interconnect structures (not shown) in the substrate 100. In one embodiment, the conductive pad 104 may be formed of a single conductive layer or multiple conductive layers. To simplify the diagram, only two conductive pads 104 formed of a single conductive layer in the substrate 100 are depicted herein as an example.

Next, the first surface 100a of the substrate 100 is covered by a cover plate 10 for protecting the sensor device 102. In one embodiment, the cover plate 10 may comprise epoxy resin, BCB resin, or another suitable insulating material. The cover plate 10 may serve as an adhesive layer, such that a support substrate 20 is attached onto the first surface 100a of the substrate 100 via the cover plate 10. In one embodiment, the support substrate 20 may comprise glass, silicon, plastic film, sapphire or another suitable support material.

Refer to FIG. 1B, in which the support substrate 20 is used for supporting the substrate 100, so as to perform a thinning process (such as an etching, milling, mechanical grinding, or chemical mechanical polishing (CMP) process) on the second surface 100b of the substrate 100, thereby reducing the thickness of the substrate 100.

Next, an opening is formed at the edge along each chip region of the substrate 100 by a lithography process and an etching process (e.g., a dry etching process, a wet etching process, a plasma etching process, a reactive ion etching process, or another suitable etching process). This opening extends from the second surface 100b of the substrate 100 to the first surface 100a of the substrate 100 and exposes the conductive pads 104 that are adjacent to the first surface 100a.

Next, an insulating layer 106 is formed on the second surface 100b of the substrate 100 and fills the opening at the edge of the chip region by a deposition process (e.g., a coating process, a physical vapor deposition process, a chemical vapor deposition process, or another suitable deposition process), so as to cover the exposed conductive pads 104.

Refer to FIG. 1C, in which the insulating layer 106 in the opening at the edge of the chip region is partially removed by a notching process, so that the opening extends into the metallization layer of the substrate 100 and exposes the sidewalls of the conductive pads 104. Next, patterned first RDLs 108 may be formed on the insulating layer 106 on the second surface 100b of the substrate 100 by a deposition process (e.g., a coating process, a physical vapor deposition process, a chemical vapor deposition process, a plating process, an electroless plating process, or another suitable deposition process), a lithography process, and an etching process. The first RDLs 108 conformally extend on the sidewall of the substrate 100, so as to form a T-contact with the exposed sidewalls of the conductive pads 104, thereby electrically connecting the conductive pads 104. Moreover, the first RDLs 108 is insulated from the substrate 100 via the insulating layer 106.

Next, a passivation layer 110 is conformally formed on the insulating layer 106 and the first RDLs 108 by a deposition process (e.g., a coating process, a physical vapor deposition process, a chemical vapor deposition process, or another suitable deposition process), so as to cover the first RDLs 108. Next, openings are formed in the passivation layer 110 by a lithography process and an etching process, so as to exposed portions of the first RDLs 108 on the second surface 100b of the substrate 100.

Next, chips 112 are attached onto the passivation layer 110 on the second surface 100b of the substrate 100. In one embodiment, the chip 112 is used for processing the signals from the sensor device 102 and may be an ISP chip or an ASIC chip. For example, the sensor device 102 may include a fingerprint-recognition device, and the chip 112 may include an ASIC chip. To simplify the diagram, only two chips 112 are depicted herein as an example.

Refer to FIG. 1D, in which first conductive structures 114 are formed on the first RDLs 108 and second conductive structures 116 are formed on the chips 112. In the embodiment, the first conductive structures 114 are correspondingly formed in the openings of the passivation layer 110, so as to directly contact the exposed first RDLs 108, thereby electrically connecting the first RDLs 108. Moreover, the second conductive structures 116 are formed on the chips 112, so as to electrically connect the chips 112. In one embodiment, each first conductive structure 114 and each second conductive structure 116 respectively include at least one bonding ball, such as a metal bonding ball. In one embodiment, each first conductive structure 114 includes two or more bonding balls that are stacked on one of the first RDLs 108 in a direction perpendicular to the second surface 100b of the substrate 100. Each second conductive structure is disposed on one of the chips 112 and includes a single bonding ball.

Next, an encapsulation layer 118 may be formed on the second surface 100b of the substrate 100 by a molding process or a deposition process (e.g., a coating process, a physical vapor deposition process, a chemical vapor deposition process, or another suitable deposition process), so as to cover the chips 112, the first RDLs 108, the first conductive structures 114, and the second conductive structures 116.

Refer to FIG. 1E, in which a polishing process 120 is performed on the encapsulation layer 118, so as to expose the first conductive structures 114 and the second conductive structures 116. As a result, the upper surfaces of the first conductive structures 114, the second conductive structures 116, and the encapsulation layer 118 are level with each other and adjacent to the subsequently formed second RDLs 122 (as shown in FIG. 1F).

Refer to FIG. 1F, in which patterned second RDLs 122 are formed on the encapsulation layer 118 using the processes that are the same as or similar to those for forming the first RDLs 108. In the embodiment, the second RDLs 122 are electrically connected to the first RDLs 108 via the exposed first conductive structures 114, and electrically connected to the chips 112 via the second conductive structures 116.

Next, the encapsulation layer 118 and the second RDLs 122 are covered by a passivation layer 124 that is formed using the process that is the same as or similar to that for forming the passivation layer 110. In the embodiment, the passivation layer 124 includes openings therein, so as to expose portions of the second RDLs 122 on the encapsulation layer 118. Thereafter, solder bumps 126 and dummy solder bumps (not shown) are formed over the encapsulation layer 118 and pass through the passivation layer 124. In one embodiment, the solder bumps 126 are electrically connected to the second RDLs 122 via the openings of the passivation layer 124. Moreover, the dummy solder bumps are not electrically connected to the devices in the substrate 100 and the chips 112. The subsequently formed chip package may be bonded onto a circuit board (not shown) via the solder bumps 126.

Refer to FIG. 1G, in which the support substrate 20 is removed. Thereafter, a dicing process may be performed along the scribe lines between adjacent chip regions of the substrate 100, so as to form individual chip packages.

Refer to FIGS. 3A to 3D, which illustrate cross-sectional views of another exemplary embodiment of a method for forming a chip package according to the invention. Elements in 3A to 3D that are the same as those in FIGS. 1A to 1G are labeled with the same reference numbers as in FIGS. 1A to 1G and are not described again for brevity. As shown in FIG. 3A, a structure may be formed by the same or similar embodiments shown in FIGS. 1A to 1D. In the embodiment, the structure is similar to the structure shown in FIG. 1D. The difference is that each first conductive structure 114 shown in FIG. 3A is a single bonding ball. Moreover, compared to the encapsulation layer 118 in FIG. FIG. 1D, the encapsulation layer 118 in FIG. FIG. 3A has a greater thickness.

Refer to FIG. 3B, in which a drilling process (e.g., a laser drilling process, an etching process, or another suitable process) is performed on the encapsulation layer 118, so that the encapsulation layer 118 has first openings exposing the first conductive structures 114 and second openings 118b exposing the second conductive structures 116.

Refer to FIG. 3C, in which patterned second RDLs 122 are formed on the encapsulation layer 118 using the processes that are the same as or similar to those for forming the first RDLs 108. In the embodiment, the second RDL 122 conformally extends into one of the first openings 118a and one of the second opening 118b to respectively connect to one of the first conductive structures 114 and one of the second conductive structures 116. Moreover, another second RDL 122 may conformally extend into another second opening 118b, so as to connect the second conductive structure 116 on another chip 122.

Next, the encapsulation layer 118 and the second RDLs 122 are covered by a passivation layer 124 that is formed using the process that is the same as or similar to that for forming the passivation layer 110. In the embodiment, the passivation layer 124 includes openings therein, so as to expose portions of the second RDLs 122 on the second surface 100b of the substrate 100. In the embodiment, the passivation layer 124 may partially fill the first openings 118a and the second openings 118b, so that gaps are formed between the second RDLs 122 and the passivation layer 124 in the first and second openings 118a and 118b. In some embodiments, the passivation layer 124 may fully fill the first and second openings 118a and 118b. Thereafter, solder bumps 126 and dummy solder bumps (not shown) are formed over the encapsulation layer 118 and pass through the passivation layer 124. In one embodiment, the solder bumps 126 are electrically connected to the second RDLs 122 via the openings of the passivation layer 124. Moreover, the dummy solder bumps are not electrically connected to the devices in the substrate 100 and the chips 112. The subsequently formed chip package may be bonded onto a circuit board (not shown) via the solder bumps 126.

Refer to FIG. 3D, in which the support substrate 20 is removed. Thereafter, a dicing process may be performed along the scribe lines between adjacent chip regions of the substrate 100, so as to form individual chip packages.

In the embodiment, since the encapsulation layer 118 of the chip package has a greater thickness than that of the encapsulation layer 118 of the chip package in FIG. 1G, better mechanical strength can be obtained. However, since the encapsulation layer 118 of the chip package has a greater thickness than that of the encapsulation layer 118 of the chip package in FIG. 1G, the chip package in FIG. 1G has a relatively smaller size, which contributes to reducing the size of the electronic or optoelectronic product.

Refer to FIGS. 5A to 5F, which illustrate cross-sectional views of another exemplary embodiment of a method for forming a chip package according to the invention. Elements in 5A to 5F that are the same as those in FIGS. 1A to 1G are labeled with the same reference numbers as in FIGS. 1A to 1G and are not described again for brevity. As shown in FIG. 5A, a structure may be formed by a method that is the same as or similar to that shown in FIGS. 1A to 1B. In the embodiment, the structure is similar to the structure shown in FIG. 1B. The difference is that there is no insulating layer 106 formed on the second surface 100b of the substrate 100 or to cover the exposed conductive pads 104.

Refer to FIG. 5B, in which chips 112 are attached onto the second surface 100b of the substrate 100. In one embodiment, the chip 112, such as an ISP chip or an ASIC chip, is used for processing the signals from the sensor device 102. For example, the sensor device 102 may include a fingerprint-recognition device, and the chip 112 may include an ASIC chip. To simplify the diagram, only two chips 112 are depicted herein as an example. In the embodiment, each chip 112 has metal bumps 112a. In one embodiment, the metal bumps 112a may include solder balls, conductive posts or other suitable conductive structures and may comprise tin, lead, copper, gold, nickel, or a combination thereof, or another suitable conductive material.

Next, an encapsulation layer 118 may be formed on the second surface 100b of the substrate 100 by a molding process or a deposition process (e.g., a coating process, a physical vapor deposition process, a chemical vapor deposition process, or another suitable deposition process), so as to cover the chips 112 and the metal bumps 112a, and fill the opening at the edge of each chip region, thereby covering the exposed conductive pads 104.

Refer to FIG. 5C, in which a polishing process 120 is performed on the encapsulation layer 118 to expose the metal bumps 112a. As a result, the upper surfaces of the metal bumps 112a and the encapsulation layer 118 are level with each other and adjacent to the subsequently formed RDLs. Next, the encapsulation layer 118 in the opening at the edge of each chip region is partially removed by a notching process, so that the opening extends into the metallization layer of the substrate 100 and exposes the sidewalls of the conductive pads 104.

Refer to FIG. 5D, in which patterned RDLs 222 may be formed on the encapsulation layer 118 on the second surface 100b of the substrate 100 by a deposition process (e.g., a coating process, a physical vapor deposition process, a chemical vapor deposition process, a plating process, an electroless plating process, or another suitable deposition process), a lithography process, and an etching process. The RDLs 222 are electrically insulated from the substrate 100 via the encapsulation layer 118. Moreover, one end of at least one of the RDLs 222 conformally extends to the sidewall of the substrate 100, so as to form a T-contact with the exposed sidewall of the conductive pad 104, thereby electrically connecting the conductive pad 104. Another end of this RDL 222 is electrically connected to the exposed metal bump 112a. Moreover, at least another RDL 222 is electrically connected to the exposed metal bump 112a on another chip 112.

Refer to FIG. 5E, in which the encapsulation layer 118 and the RDLs 222 are covered by a passivation layer 124. In the embodiment, the passivation layer 124 includes openings therein, so as to expose portions of the RDLs 222 over the second surface 100b of the substrate 100. Thereafter, solder bumps 126 and dummy solder bumps (not shown) are formed over the encapsulation layer 118 and pass through the passivation layer 124. In one embodiment, the solder bumps 126 are electrically connected to the RDLs 222 via the openings of the passivation layer 124. Moreover, the dummy solder bumps are not electrically connected to the devices in the substrate 100 and the chips 112. The subsequently formed chip package may be bonded onto a circuit board (not shown) via the solder bumps 126.

Refer to FIG. 5F, in which the support substrate 20 is removed. Thereafter, a dicing process may be performed along the scribe lines between adjacent chip regions of the substrate 100, so as to form individual chip packages. In the embodiment, since the chip package has RDLs 222 only and the encapsulation layer 118 has a less thickness than that of the encapsulation layer 118 of the chip package in FIG. 1G, the chip package has a relatively smaller size than that of the chip package in FIG. 1G, thereby contributing to reducing the size of the electronic or optoelectronic product.

According to the foregoing embodiments, the bonding balls and T-contact are used as a path for an exterior electrical connection in a substrate having a sensor device, so as to integrate chips with different functionalities into a single chip package. As a result, demand for the electronic or optoelectronic products can be met without increasing the number of chip packages, thereby maintaining or reducing the size of the electronic or optoelectronic products and reducing the cost.

While the invention has been disclosed in terms of the preferred embodiments, it is not limited. The various embodiments may be modified and combined by those skilled in the art without departing from the concept and scope of the invention.

What is claimed is:

1. A chip package, comprising:
    a substrate having a first surface and a second surface opposite thereto, wherein the substrate comprises a sensor device and a plurality of conductive pads that are adjacent to the first surface;
    a plurality of chips attached onto the second surface of the substrate;
    an encapsulation layer disposed on the second surface of the substrate to cover the plurality of chips;
    a plurality of first redistribution layers (RDLs) disposed between the second surface of the substrate and the encapsulation layer and electrically connected to the plurality of conductive pads;
    a plurality of second RDLs disposed on the encapsulation layer; and
    a plurality of first conductive structures and a plurality of second conductive pads disposed in the encapsulation layer,
    wherein each of the plurality of first conductive structures and each of the plurality of second conductive structures respectively comprise at least one bonding ball, and
    wherein at least one of the plurality of first conductive structures is configured to connect at least one of the plurality of first RDLs and at least one of the plurality of second RDLs, and at least one of the plurality of second conductive structures is configured to connect at least one of the plurality of second RDLs and at least one of the plurality of chips.

2. The chip package as claimed in claim 1, wherein each of the plurality of first conductive structures comprises a plurality of bonding ball that are stacked on one of the plurality of first RDLs in a direction perpendicular to the second surface of the substrate, and each of the plurality of second conductive structures is disposed on one of the plurality of chips.

3. The chip package as claimed in claim 2, wherein upper surfaces of the plurality of first conductive structures, the plurality of second conductive structures and the encapsulation layer are level with each other and adjacent to the plurality of second RDLs.

4. The chip package as claimed in claim 1, wherein the encapsulation layer comprises a plurality of first openings to expose the plurality of first conductive structures, and a plurality of second openings to expose the plurality of second conductive structures, and wherein at least one of the plurality of second RDLs extends into one of the plurality of first openings to connect to one of the plurality of first conductive structures, and at least another one of the plurality of second RDLs extends into one of the plurality of second openings to connect to one of the plurality second conductive structures.

5. The chip package as claimed in claim 4, wherein upper surfaces of the plurality of first conductive structures, the plurality of second conductive structures and the encapsulation layer are not level with each other.

6. The chip package as claimed in claim 1, further comprising:
 a passivation layer covering the encapsulation layer and the plurality of second RDLs; and
 a plurality of solder bumps and a plurality of dummy solder bumps disposed over the encapsulation layer and passing through the passivation layer, wherein the plurality of solder bumps is electrically connected to the plurality of second RDLs.

7. The chip package as claimed in claim 1, further comprising a cover plate covering the first surface of the substrate.

8. The chip package as claimed in claim 1, wherein the sensor device comprises a fingerprint-recognition device, and the plurality of chips comprises application-specific integrated circuit chips.

\* \* \* \* \*